(12) United States Patent
Majumdar et al.

(10) Patent No.: US 8,884,804 B1
(45) Date of Patent: Nov. 11, 2014

(54) TIME-TO-DIGITAL CONVERSION

(71) Applicant: Xilinx, Inc., San Jose, CA (US)

(72) Inventors: Amitava Majumdar, San Jose, CA (US); Siva Charan Nimmagadda, Hyderabad (IN); Baanurathan Sadasivam, Hyderabad (IN); Richard W. Swanson, San Jose, CA (US); Yohan Frans, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/089,222

(22) Filed: Nov. 25, 2013

(51) Int. Cl.
*H03M 1/50* (2006.01)
*H03M 1/12* (2006.01)
*H03L 7/081* (2006.01)
*H03L 7/087* (2006.01)
*H03L 7/089* (2006.01)
*H03M 1/00* (2006.01)

(52) U.S. Cl.
CPC . *H03M 1/50* (2013.01); *H03M 1/12* (2013.01); *H03L 7/0814* (2013.01); *H03L 7/087* (2013.01); *H03L 7/0891* (2013.01); *H03L 7/0895* (2013.01); *H03M 2201/4233* (2013.01); *H03M 1/00* (2013.01)
USPC .......................................... 341/166; 341/120

(58) Field of Classification Search
CPC . H03M 2201/4233; H03M 1/00; H03M 1/12; H04N 1/505; H03L 7/0891; H03L 7/0814; H03L 7/087; G06F 1/10; G06F 1/08
USPC .......... 341/166, 168, 120, 155; 327/159, 156, 327/158, 107, 291, 294, 142
See application file for complete search history.

(56) References Cited

U.S. PATENT DOCUMENTS 8,284,086 B2 * 10/2012 Loeda et al. .................. 341/143

OTHER PUBLICATIONS

Das, Pratap Kumar et al., "On-Chip Clock Network Skew Measurement using Sub-Sampling," *Proc. of the IEEE Asian Solid-State Circuits Conference*, Nov. 3, 2008, IEEE, Piscataway, New Jersey, USA.
Larsson, Patrik, "Measurements and Analysis of PLL Jitter Caused by Digital Switching Noise," *IEEE Journal of Solid-State Circuits*, Jul. 2001, pp. 1113-1119, vol. 36, No. 7, IEEE, Piscataway, New Jersey, USA.
McKay, M. D. et al., "A Comparison of Three Methods for Selecting Values of Input Variables in the Analysis of Output from a Computer Code," *Technometrics*, published May 1979, received Jan. 1977, pp. 239-245, vol. 21, No. 2, American Statistical Association, Alexandria, Virginia, USA.
Moon, Y. et al., "A 0.6-2.5 Gbaud CMOS Tracked 3x Oversampling Transceiver with Dead-Zone Phase Detection for Robust Clock/Data Recovery," *Proc. of the 2001 International Solid-State Conference*, Feb. 6, 2001, pp. 1-3, IEEE, Piscataway, New Jersey, USA.

(Continued)

*Primary Examiner* — Joseph Lauture
(74) *Attorney, Agent, or Firm* — W. Eric Webostad; Lois D. Cartier

(57) ABSTRACT

An apparatus relating generally to time-to-digital conversion is disclosed. In this apparatus, a time-to-digital converter is coupled to a period sensor. The period sensor includes a pulse generator to generate a pulse. An integrator of the period sensor is coupled to receive the pulse to generate an analog voltage signal responsive to the pulse. The time-to-digital converter includes an analog-to-digital converter coupled to provide a digital signal associated with the analog voltage signal.

20 Claims, 7 Drawing Sheets

(56) References Cited

OTHER PUBLICATIONS

Shinagawa, Mitsuru et al., "Jitter Analysis of High-Speed Sampling Systems," *IEEE Journal of Solid-State Circuits*, Feb. 1990, pp. 220-224, vol. 25, No. 1, IEEE, Piscataway, New Jersey, USA.

Sunter, Stephen et al;., "BIST for Phase-Locked Loops in Digital Applications," *Proc. of the IEEE International Test Conference*, Sep. 27, 1999, pp. 532-540, IEEE, Piscataway, New Jersey, USA.

Sunter, Stephen et al;., "Purely Digital BIST for any PLL or DLL," *Proc. of the 12th IEEE European Test Symposium*, May 20, 2007, pp. 1-6, IEEE, Piscataway, New Jersey, USA.

Tang, Wei et al., "A Jitter Measurement Circuit Based on Dual Resolution Vernier Oscillator," *Proc. of the 8th IEEE International Conference on ASIC*, Oct. 20, 2009, pp. 1213-1216, IEEE, Piscataway, New Jersey, USA.

Tsai, Chin-Cheng et al., "An On-Chip Jitter Measurement Circuit for the PLL," *Proc. of the 12th Asian Test Symposium*, Nov. 17, 2003, pp. 332-335, IEEE, Piscataway, New Jersey, USA.

Vamvakos, Socrates D. et al., "PLL On-Chip Jitter Measurement: Analysis and Design," *2006 Symposium on VLSI Circuits Digest of Technical Papers*, Jun. 15, 2006, pp. 73-74, IEEE, Piscataway, New Jersey, USA.

Wilstrup, Jan, "A Method of Serial Data Jitter Analysis Using One-Shot Time Interval Measurements," *Proc. of the IEEE International Test Conference*, Oct. 18, 1998, pp. 819-823, IEEE, Piscataway, New Jersey, USA.

Xia, Tian et al., "On-Chip Jitter Measurements for Phase Locked Loops," *Proc. of the IEEE International Symposium on Defect and Fault Tolerance in VLSI Systems*, Nov. 6, 2002, pp. 399-407, IEEE, Piscataway, New Jersey, USA.

* cited by examiner

TIME-TO-DIGITAL CONVERSION

TECHNICAL FIELD

The following description relates to integrated circuit devices ("ICs"). More particularly, the following description relates to time-to-digital conversion in an IC.

BACKGROUND

Clock jitter is a known problem. Clock jitter is generally thought of as a variation of clock period and/or clock-signal transition times over time. These variations may be due to one or more of supply noise, temperature variations, and process variations.

Accordingly, it would be desirable and useful to provide time-to-digital conversion that may be used for measurement, such as for the measurement of clock jitter, for example.

SUMMARY

An apparatus relates generally to time-to-digital conversion. In such an apparatus, a time-to-digital converter is coupled to a period sensor. The period sensor includes a pulse generator to generate a pulse. An integrator of the period sensor is coupled to receive the pulse to generate an analog voltage signal responsive to the pulse. The time-to-digital converter includes an analog-to-digital converter coupled to provide a digital signal associated with the analog voltage signal.

A method relates generally to providing a digital signal. In such a method, a pulse is generated with a pulse generator of a period sensor responsive to a clock signal and a trigger signal provided to the pulse generator. An analog signal is generated from the pulse with an integrator. The analog signal is converted to the digital signal with a differential analog-to-digital converter of a time-to-digital converter. The analog signal is coupled to a first input port of the differential analog-to-digital converter. A reference signal is coupled to a second input port of the differential analog-to-digital converter. The digital signal output from the differential analog-to-digital converter is registered.

Another method relates generally to providing a digital signal. A pulse is generated with a pulse generator of a period sensor responsive to a clock signal and a trigger signal provided to the pulse generator. A first analog voltage signal and a second analog voltage signal are generated from the pulse with from a first integrator leg and a second integrator leg. The first analog voltage signal and the second analog voltage signal are generated to be different from one another. The first analog voltage signal and the second analog voltage signal are converted to the digital signal with a differential analog-to-digital converter of a time-to-digital converter. The first analog voltage signal is coupled to a first input port of the differential analog-to-digital converter. The second analog voltage signal is coupled to a second input port of the differential analog-to-digital converter. The digital signal output from the differential analog-to-digital converter is registered.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
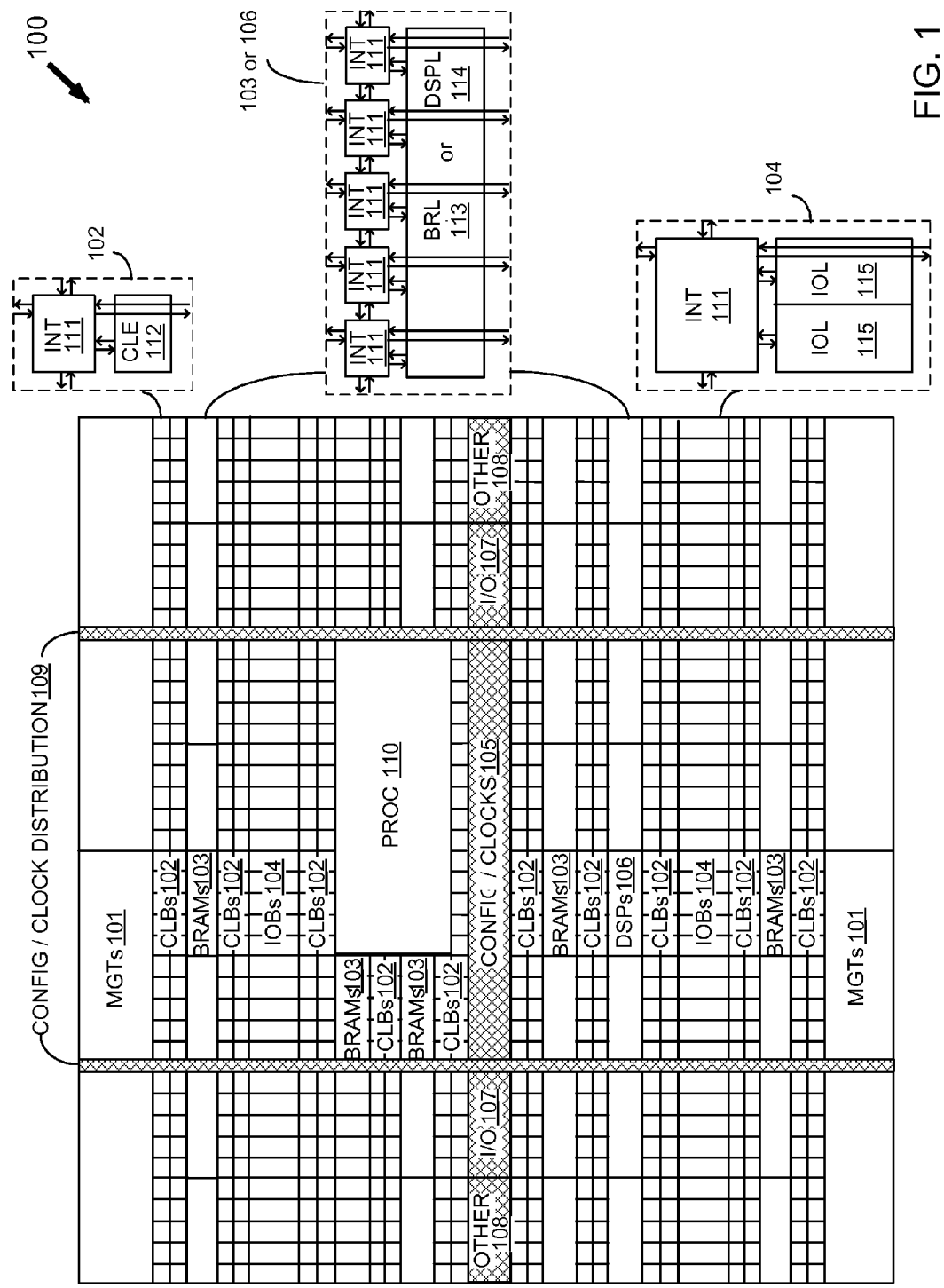
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

There are several types of clock jitter. Period jitter is a variation in clock period or duty cycle. Cycle-to-cycle jitter is a special case of period jitter, which may be found by tracking variations in periods of two consecutive clock cycles. Time-interval-error or absolute jitter is variation in clock transitions compared with an ideal transition time. Long-term jitter or drift is variation in any of the other jitter metrics over an extended period of time. Long-term jitter can be unidirectional, such as clock transition time drifting over time, or can be bi-directional.

As described below in additional detail, a system that may be used for determining clock jitter is described. In such a system, a pulse associated with a clock signal period or duty cycle is generated responsive to assertion of a trigger signal. This trigger signal may be cleaned locally by a pulse generator used to generate such pulse. Furthermore, such pulse generator is clocked responsive to such clock signal, so a generated pulse may be used to determine a clock jitter for such clock signal without having to use a separate clock signal, which may be independent of the clock signal being measured.

With the above general understanding borne in mind, various configurations for a measurement system, which may be used to measure clock jitter for example, are generally described below.

Because one or more of the above-described examples are described herein using a particular type of IC, a detailed description of such an IC is provided below. However, it should be understood that other types of ICs may benefit from one or more of the techniques described herein. Along those lines, many different types of systems-on-chip ("SoCs") may have an analog test bus and one or more analog-to-digital converters, among other components.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Analog signals may be subject to noise from various sources, including thermal noise and power supply noise. If S is an analog signal and if S' is a measured version of such analog signal S, then S' may generally be thought of as the noisy version of S. With this understanding, S' may be generally expressed as follows:

$$S' = \alpha S + \beta \qquad (1)$$

where $\alpha$ and $\beta$ are constants which may be determined by process, voltage, and thermal ("PVT") environment at a time of measurement. For convenience, the parameter $\alpha$ is called the noise gain, and the parameter $\beta$ is called the noise offset.

Figure 2:
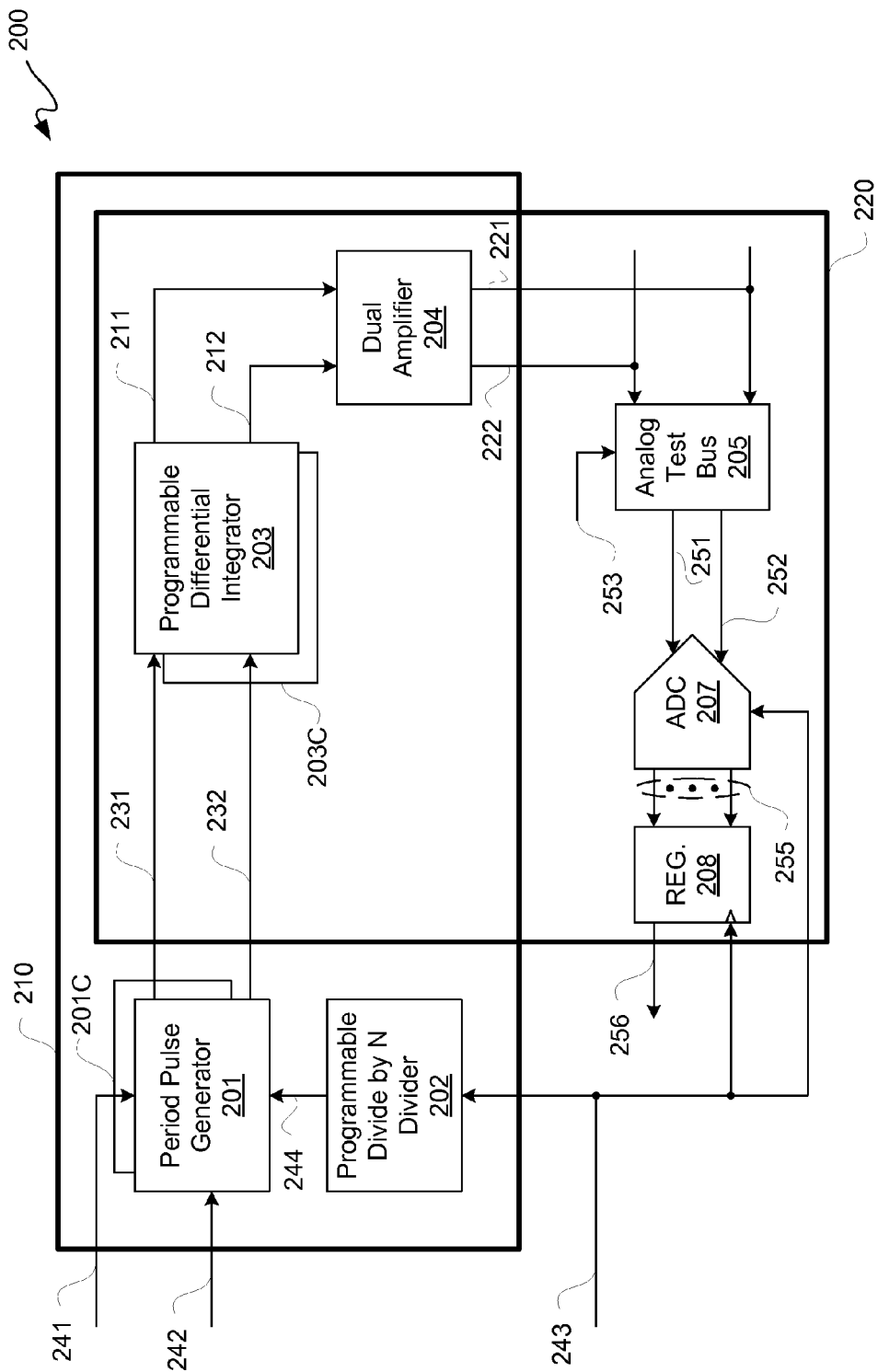
FIG. 2 is a block/circuit diagram depicting an exemplary measurement system.

FIG. 2 is a block/circuit diagram depicting an exemplary measurement system 200. Measurement system 200, which may be used for a clock jitter measurement, includes a period sensor, such as distributed period sensor 210 for example, and a time-to-digital converter ("TDC"), such as differential TDC 220 for example. Measurement system 200 is described below in terms of implementation in an FPGA, such as FPGA 100 of FIG. 1 for example; however, it should be appreciated that other types of ICs, such as DSPs, microprocessors, SoCs, ASICs, ASSPs, or other ICs, having mixed signal capability may be used. Along those lines, a programmable SoC ("PSoC") having a CPU and one or more mixed-signal arrays may be used. Additionally or alternatively, a monolithic or multi-die implementation may be used, where the latter includes a system-in-package ("SiP").

Distributed period sensor 210 may include a pulse generator, such as period pulse generator 201 for example, and a divide-by-N divider, such as programmable divide-by-N divider 202 for example. Period pulse generator 201 may generate a single period at a time, namely be a single period pulse generator. For purposes of clarity by way of example and not limitation, it shall be assumed that N is a positive integer greater than zero. Distributed period sensor 210 may share an integrator, such as a programmable differential integrator 203 for example, and an amplifier, such as a dual amplifier 204 for example, with differential TDC 220. Differential TDC 220 may further include an analog test bus 205, a multiplexer (not shown in this figure), an analog-to-digital converter ("ADC") 207, and a bank, block, or file of registers ("register") 208. Optionally, programmable differential integrator 203 may be a programmable differential sample and hold circuit. Furthermore, even though programmability is described to allow for a range of frequencies to be covered, fixed values may be used in another implementation where a fixed frequency is used.

A clock under test signal ('clock signal') 243 may be directly provided to period pulse generator 201 or provided to period pulse generator 201 via programmable divide-by-N divider 202, as illustratively depicted. By having a programmable divider, a user may select an integer value of N to use to provide a sampling frequency. A divided down version of clock signal 243, namely divided clock signal 244, may be provided as a clock input to period pulse generator 201 to sample a low-priority trigger signal 241 to generate a pulse, such as a 1-0-1 pulse, on pulse signal 231 output from period pulse generator 201. Effectively, trigger signal 241 may be asserted to take a measurement of a clock signal 243 or 244.

Another input to period pulse generator 201 is a mode select signal 242. Mode select signal 242 may be used to select either a period mode or a duty-cycle mode. Thus, measurement system 200 may be set to determine period jitter or duty-cycle jitter, the latter of which is a type of period jitter, responsive to selection of a period or a duty cycle mode by setting of mode select signal 242. Even though measurement system 200 is described in terms of obtaining a measurement for determination of a clock jitter, it should be understood that measurement system 200 may be used to measure other parameters of a clock signal or other oscillating or pulsed signal. Again, period jitter is a variation in clock period or duty cycle, where the latter is a measurement of cycle-to-cycle jitter. For purposes of clarity by way of example and not limitation, generally measurement of jitter for a period of a clock cycle is described below, as such description likewise is applicable to determining cycle-to-cycle jitter. Accordingly, it shall be assumed that mode select signal 242 is set to a period mode setting. Optionally, another pulse generator 201C and another programmable differential integrator 203C may be used to determine cycle-to-cycle jitter. Determination of cycle-to-cycle jitter follows from the following description of determining period jitter. However, determination of period jitter is generally described below for purposes of clarity, as determining cycle-to-cycle jitter follows from such description.

Pulse signal 231 and reset signal 232, both of which may be outputs of period pulse generator 201, may be provided as inputs to a differential TDC 220. Such inputs may be used by differential TDC 220 to effectively digitize duration of time of a pulse on pulse signal 231.

Trigger signal 241 need not be a jitter free or substantially jitter constrained signal, such as a low slew rate signal for example, as trigger signal 241 may be locally cleaned up, as described below in additional detail. Along those lines, a register or registers used to clean up such trigger signal 241 may be clocked responsive to clock signal 243 or 244, namely the clock signal for which jitter is to be determined. Optionally, trigger signal 241 may be cleaned up with non-clocked circuits, such as Schmitt triggers or hysteretic comparators for example. Thus, there is a relationship between such clock signal under test and a locally cleaned-up trigger signal, where output of such register or registers effectively is a measure of an indicator of a length of a time of a clock signal under test which increases with period and vice versa. This need not be thought of as an exact value but more generally may be thought of as a relationship, which may be mathematically expressed for example. As described below in additional detail, a pulse of pulse signal 231 output from pulse generator 201 has a duration that is a monotonic function of a period of a clock signal 244, namely there is a monotonic functional relationship between such pulse duration and clock period.

Differential TDC 220 may generally be thought of as having four stages, where programmable differential integrator 203 is Stage 1, dual amplifier 204 is Stage 2, analog test bus 205 is Stage 3, and ADC 207 is Stage 4. Optionally, period pulse generator 201 may be thought of as a Stage 0 of differential TDC 220. For Stages 3 and 4, an FPGA may already include an analog test bus and an ADC, and rather than instantiating these circuits in programmable resources, such hard macros may be used.

Programmable differential integrator 203 may generate two different voltage values, namely analog voltage signal 211 and analog voltage signal 212, where each voltage value may be directly proportional to the time duration of a pulse P on pulse signal 231 provided as an input to programmable differential integrator 203. Analog voltage signal 211 and analog voltage signal 212 represent a differential voltage. These voltage values may be stored in capacitors (not shown in this figure) that are part of programmable differential integrator 203. More particularly, programmable differential integrator 203 may be programmable differential resistive-capacitive network circuit. Programmability of programmable differential integrator 203 allows for a wider range of clock periods, namely a wider range of clock frequencies. This programmability facilitates selection of RC networks to be used for ramping two spaced apart signals.

Figure 4:
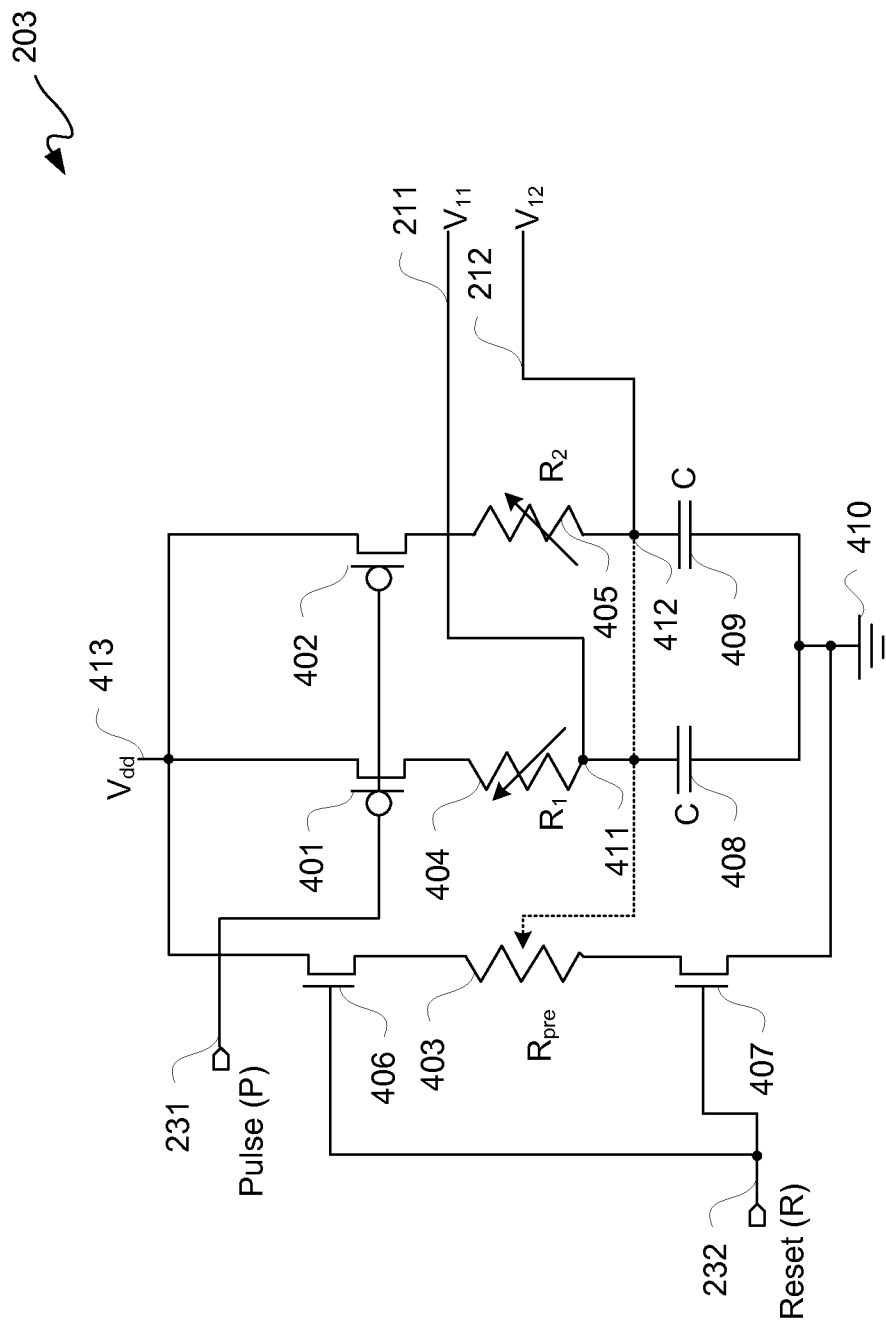
FIG. 4 is a circuit diagram depicting an exemplary programmable differential integrator.

FIG. 4 is a circuit diagram depicting an exemplary programmable differential integrator 203. Programmable differential integrator 203 includes switches 406 and 407, PMOS transistors 401 and 402, adjustable resistors 404 and 405, discrete capacitors 408 and 409, and an adjustable precharge resistor 403. Switches 406 and 407 are illustratively depicted as NMOS transistors; however, in an implementation switch 406 may be a PMOS transistor with its gated connected to an inverted version of reset signal 232. In other configurations, different polarities of transistors, adjustable capacitors with fixed resistors, adjustable resistors and adjustable capacitors, or any combination thereof may be used.

Enable or activation inputs of switches 406 and 407 are gated with reset signal 232. Reset signal 232 may be held at a logic high state until just before a pulse P on pulse signal 231 is to be processed, at which point in time reset signal 232 may be deasserted to a logic low state. For purposes of clarity by way of example and not limitation, it shall be assumed that a 1-0-1 pulse on signal 231 is measured, namely a falling edge triggered measure. In other words, duration of a negative pulse is measured. However, in other configurations, duration of a positive pulse may be measured.

A terminal of switch 406 is coupled to a supply voltage node 413, which for purposes of clarity and not limitation is indicated as a Vdd supply node, and another terminal of switch 406 is coupled to a precharge resistor 403 having a precharge resistance $R_{pre}$. Resistance of precharge resistor 403 may be programmatically set to set a precharge voltage for programmable differential integrator 203.

A terminal of switch 407 is coupled to another end of precharge resistor 403, such that precharge resistor 403 is coupled in series between terminals of switches 406 and 407, respectively. Another terminal of switch 407 is coupled to a ground node 410. When reset signal 232 is asserted, switches 406 and 407 are in at least a substantially conductive state ("ON") such that supply node 413 is coupled to ground node 410 through precharge resistor 403. In such state, pulse signal 231 is held at a logic high state, and so PMOS transistors 401 and 402, which gates such PMOS transistors, are in at least a substantially non-conductive state ("OFF"). Effectively, a reset circuit with a programmable voltage divider and switches is provided by adjustable resistor 403 and switches 406 and 407.

Source nodes of PMOS transistors 401 and 402 are coupled to supply voltage node ("supply node") 413, and drain nodes of PMOS transistors 401 and 402 are coupled to adjustable resistors 404 and 405, respectively. Resistances R1 and R2 respectively of adjustable resistors 404 and 405 may be programmatically set, and may be set to two different values. Discrete capacitors 408 and 409 are respectively coupled to other ends of adjustable resistors 404 and 405, and discrete capacitors 408 and 409 may be commonly coupled to ground node 410. An output node 411 between adjustable resistor 404 and capacitor 408 is used to source analog voltage signal 211, and an output node 412 between adjustable resistor 405 and capacitor 409 is used to source analog voltage signal 212.

Delay between deassertion of reset signal 232 and an incoming pulse P on pulse signal 231 may be well controlled, such that switches 406 and 407 are switched OFF and PMOS transistors 401 and 402 are switched ON. With programmable differential integrator 203 at a precharge level or thereabouts, a negative pulse turns ON PMOS transistors 401 and 402, which causes analog voltage signals 211 and 212 to respectively ramp up corresponding to their respective resistive-capacitive (RC) delays. In another configuration, programmable differential integrator 203 may be implemented as two separate circuits. However, as one circuit is used to produce two analog voltage outputs that are different from one another, the term "differential" is used. Analog voltage signals 211 and 212 are not complements of one another, and so this is not a differential output. However, analog voltage signals 211 and 212 are different from one another, and so this output is termed a "differential" output.

With renewed reference to FIG. 2, analog voltage signal 211 and analog voltage signal 212 may be provided as inputs to a high input-impedance dual amplifier 204 to generate output voltages, namely output voltage signal 221 and output voltage signal 222. By "high input-impedance" dual amplifier 204, it is generally meant that input impedance is sufficiently high to shield analog test bus 205 from capacitive loading of programmable differential integrator 203. Output voltage signal 221 and output voltage signal 222 may be proportional to analog voltage signal 211 and analog voltage signal 212, respectively.

Voltage outputs of output voltage signal 221 and output voltage signal 222 of dual amplifier 204 may be input or placed, for example one at a time, onto an analog test bus ("ATB") 205, as described below in additional detail. ATB 205 for example may be a 2-wire bus that carries a differential signal pair from selected points in a chip to an ADC for conversion. Along those lines, optionally in a differential mode both output voltage signal 221 and output voltage signal 222 may be placed differentially on ATB 205 at the same time for a differential input ADC 207.

A multiplexer and level shifter switches (not shown in this figure) may be used to controllably place a level shifted version of output voltage signal 221 and output voltage signal 222 one at a time in a single-ended mode, or together in a differential mode, onto ATB 205, namely a value output signal 251 therefor. A level shifter switch might not provide any or sufficient de-coupling from an input capacitance of an ATB 205. Along those lines, input impedance of dual amplifier 204 may be used to shield capacitors of programmable differential integrator 203 from an input capacitance of ATB 205 to mitigate against capacitive loading.

In other words, ATB 205 may be a shared bus, and thus may have significant capacitive loading. Accordingly, a high-input impedance dual amplifier 204 may be used to reduce the effects of such capacitive loading by masking capacitive loading of programmable differential amplifier 203, as previously described. However, dual amplifier 204 may have a high gain, such as at or close to unity, and thus effectively dual amplifier may be considered an analog buffer for buffering output voltage signals 221 and 222. If ATB 205 is not a shared bus or at least does not have significant capacitive loading, then there may be less reason for masking capacitance of programmable differential integrator 203. Along those lines, dual amplifier 204 may be omitted in some configurations.

Values on ATB 205 may be output as value output signal 251, as respectively associated with either output voltage signal 221 and output voltage signal 222. Value output signal 251 and value reference signal 252 may be provided from ATB 205 as a differential input to ADC 207. Effectively selecting between output voltage signal 221 and output voltage signal 222 may be responsive to toggling of control select signal 253, which may be used to effectively provide one signal value at a time onto ATB 205 for input to ADC 207 for conversion. Again, optionally, in a differential mode, both output voltage signal 221 and output voltage signal 222 may be placed differentially on ATB 205 at the same time. Along those lines output voltage signal 221 and output voltage signal 222 may be respectively pass gated, both of which may be gated by control select signal 253, for respectively coupling to ATB nodes via respective level shifter switches, as described below in additional detail.

Digital output signal 255 of ADC 207 may be multiple bits wide, and each digital value output represented by bits of each digital output signal 255 may be respectively stored in one or more registers of register 208. Optionally, register 208 and ADC 207 may be clocked responsive to clock signal 243 or clock signal 244; however, another clock signal unrelated to clock signal 243 may be used. For purposes of clarity by way of example and not limitation, it shall be assumed that register 208 is clocked with clock signal 243.

In this example implementation, a differential input ADC 207 may be used to convert values from ATB 205 to digital values. In this example, ADC 207 is a 16-bit 200 kilos-samples per second ADC; however, other bit widths or sampling rates for ADC 207 may be used. Each result of ADC 207 stored in registers of register 208 may be obtained as data read out 256. In this implementation, data read out 256 may be obtained or accessible through IO pins of an FPGA, such as FPGA 100 of FIG. 1 for example; however, in other configurations, register 208 may be a JTAG register accessible via a JTAG interface. Furthermore, data readout may be by storing contents of a register in memory for later readout of multiple measurements, or readout through IOs for each measurement, among other forms of readout.

The sampling rate of ADC 207 determines a time between two conversions. In this implementation, this time between two consecutive conversions is 5 microseconds; however, in other implementations, other times between two conversions may be used. Because two samples may be used, namely one for each of analog voltage signal 211 and analog voltage signal 212, per conversion of differential TDC 220, time between two consecutive TDC conversions may be twice the time between two consecutive ADC conversions. In this example, this time between two consecutive TDC conversions would be 10 microseconds. In instances of for measuring supply voltage and temperature for each TDC measurement, time between two conversions may be at least 20 microseconds. Time between two consecutive TDC conversions may be used to set or determine a "high" period of trigger signal 241 to be at least the time between two consecutive TDC conversions, so that conversion of both voltage values of analog voltage signal 211 and analog voltage signal 212 may be complete by ADC 207 before resetting differential TDC 220 by assertion of reset signal 232.

Due to there being sufficient time between two consecutive TDC conversions for parameters of ADC 207 or an analog input voltage provided thereto to fluctuate, even slightly fluctuate, such fluctuation may result in fluctuation of the lower-order bits of digital output signal 255 of ADC 207. Optionally, to mitigate such fluctuation, only higher order bits of digital output signal 255 may be used. In an example implementation, the 12 higher order bits of 16 bits of digital output signal 255 may be used. Assuming ADC 207 is powered by a 1.8 volt supply, the 12 higher order bits of digital output signal 255 provides a resolution of approximately 0.44 millivolts (i.e., 1.8V/2^12) of such ADC's input. This ADC resolution may be termed a 1-LSB (least significant bit) voltage of ADC 207. Of course, these or other values may be used as may vary from implementation to implementation. From digital output signal 255, a temporal resolution value and a noise rejection value may be determined. As described below in additional detail, temporal resolution may be optimized by using analytics therefor, and differential signaling along with characterization may be used for noise rejection.

Figure 3:
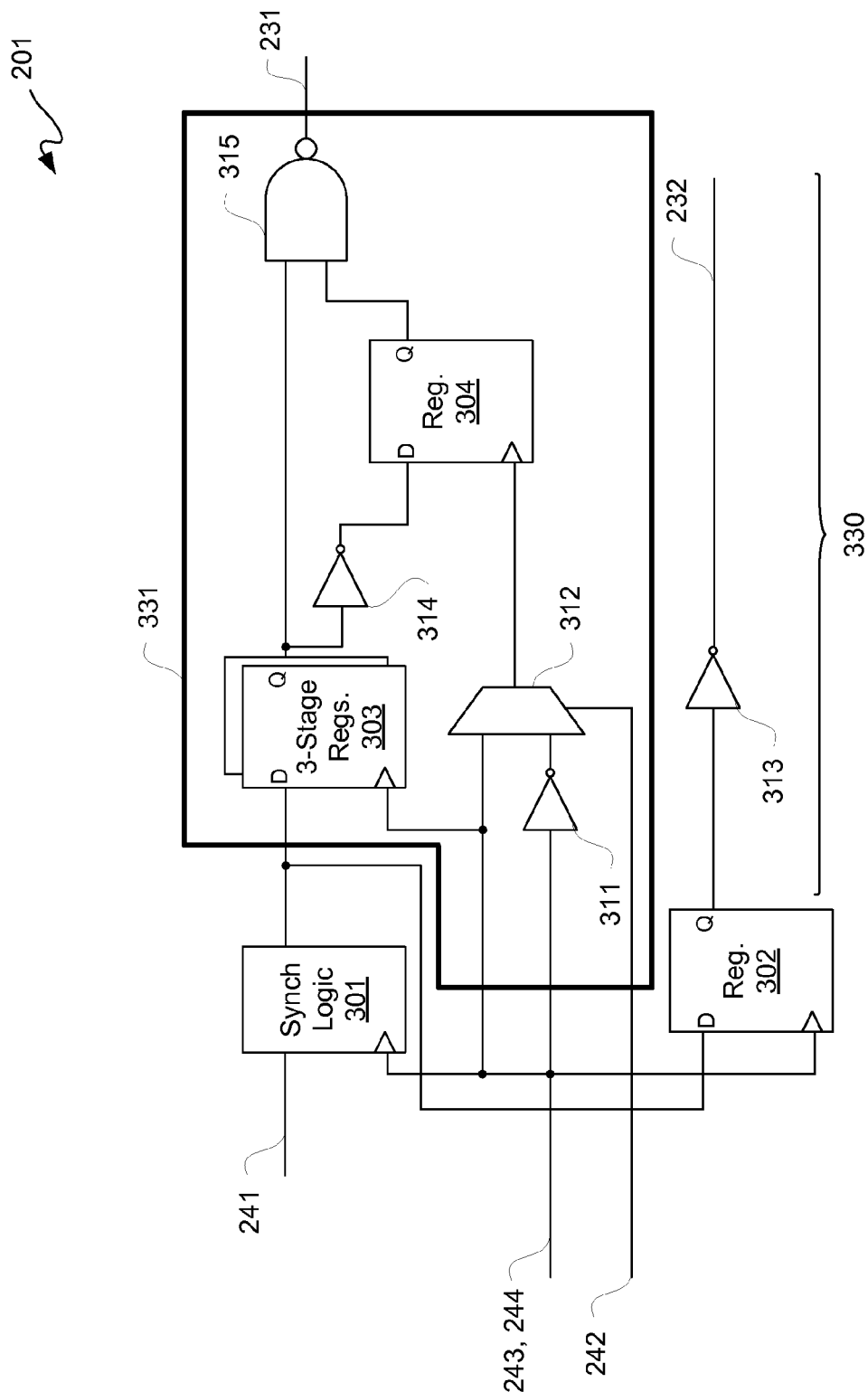
FIG. 3 is a block/circuit diagram depicting an exemplary pulse generator.

FIG. 3 is a block/circuit diagram depicting an exemplary pulse generator 201. Pulse generator 201 may be formed entirely of digital components, as illustratively depicted in FIG. 3.

Trigger signal 241 may be provided via a low priority wire, namely a wire that does not have any special jitter limitation. Trigger signal 241 may be provided as a data input to synchronization logic or synchronizer 301. Output of synchronization logic 301 may be provided as a data input to register 302 and a data input to a series of registers 303. In this example, registers 303 are three registers or register stages coupled in series and clocked responsive to a clock signal 243 or 244. However, in other configurations fewer or more than three register stages may be used. Again, clock signal 243 or 244 may be used to sample or obtain sections of trigger signal 241. Synchronization logic 301, register 302, and registers 303 are clocked with clock signal 244. Though D-type flip-flops are illustratively depicted as registers 302 and 303, it should be understood that other types of circuits and/or other number of stages may be used.

Output of synchronization logic 301 may be provided as a data input to registers 303, and a data output of registers 303 may be provided as an input to inverter 314 and an input of NAND gate 315. Output of inverter 314 may be provided as a data input to register 304. A data output of register 304 may be provided as another input to NAND gate 315. Output of NAND gate 315 may be pulse signal 231.

Clock signal 244 may be provided to clock registers 303, as well as synchronization logic 301 and register 302, and may be provided as an input to multiplexer 312 and to inverter 311. An output of inverter 311 may be provided as another input to multiplexer 312. Mode select signal 242 may be provided as a control select to multiplexer 312. Output of multiplexer 312 may be provided to clock register 304.

A data output of register 302 may be provided as an input to inverter 313. Output of inverter 313 may be reset signal 232. In this example, there is a two clock cycle delay difference or latency of clock signal 244 between pulse signal 231 and reset signal 232. However, reset signal 232 in this example is a single cycle path 330 of a clock signal 244, and even if clock signal 243 were used, reset signal 232 may be provided in a single cycle of such clock signal, which may be at a highest frequency of pulse generator 201.

Trigger signal 241 may be sampled or sectioned by a clock under test, such as either of clock signals 243 or 244. Again, it shall be assumed that clock signal 244 is used for purposes of clarity by way of example and not limitation. In this example, sampling of a positive transition on trigger signal 241 may be used to generate a 1-0-1 pulse P on pulse signal 231, namely a negative pulse. However, in another implementation, negative transition sampling may be used to generate a positive pulse.

The width of pulse P depends on the value of mode select signal 242. In this example, if mode select signal 242 is logic 0, then a positive transition on trigger signal 241 generates a pulse on that is a full clock period wide of clock signal 244. Otherwise mode select signal 242 is logic 1, and the width of a pulse P is that of the logic 1 pulse-width, namely one duty cycle, of clock signal 244. A subsequent negative transition on trigger signal 241 asserts a reset signal 232 that resets differential TDC 220. Along the above lines, the "high" period of trigger signal 241, i.e. the time between consecutive positive and negative transitions on trigger signal 241, may be for converting the time duration of a pulse P to digital values. Similarly the "low" period of trigger signal 241 may be for reset and recovery of differential TDC 220, readying differential TDC 220 for a subsequent period measurement or conversion.

Logic elements 331, as well as signals, involved in facilitating clock signal 244 to sample trigger signal 241 to provide a pulse P on pulse signal 231 may be sized. For example, transistors and wires may be sized up in order to reduce the effect of PVT variations, and use of thick-oxide transistors may reduce the effect of PVT variations. When trigger signal 241 transitions from 0 to 1, differential TDC 220 may be configured to be out of reset before a next pulse P on pulse signal 231 reaches programmable differential integrator 203. In this example, delay on a path from trigger signal 241 to pulse signal 231 may be a minimum of a six cycle delay for measuring period jitter and a minimum of a seven cycle delay for measuring duty cycle jitter. However, in other implementations, these or other delays may be used.

With renewed reference to FIG. 4, effectively programmable differential integrator 203 has two "legs", each having an RC circuit that is powered up by a respective PMOS switch transistor 401 and 402. While resistor values in each resistor ladder or adjustable resistor 404 and 405 may be variable and individually programmable, capacitors 408 and 409 may have the same value. However, in another configuration, such capacitors can be programmable to different values. However, for purposes of clarity and not limitation, fixed discrete capacitors may be assumed.

Pulses on pulse signal 231 and reset signal 232 are driven by pulse generator 201 of FIG. 2. When reset signal 232 is at a logic 1 level, or alternatively stated when trigger signal 241 is at a logic 0 level, pulse signal is a logic 1 level, and so: Switches 406 and 407 may be considered to be in their ON state, and PMOS transistors 401 and 402 may be considered to be in their OFF state. The amount of time that reset signal 232 is held high is assumed to be long enough for capacitors 408 and 409 to charge up to a steady state precharge voltage. This precharge voltage depends on the capacitance value of capacitors 408 and 409, as well as the selected value of the voltage divider, namely a set value of adjustable resistor 403. In this example, allowable precharge voltage values range from 0V to approximately 0.9V.

About 4 clock cycles before pulse signal 231 transitions from 1-to-0, reset signal 232 transitions to 0 and turns OFF switches 406 and 407. When pulse signal 231 is at logic 0, PMOS transistors 401 and 402 turn ON and capacitors 408 and 409 start charging up through adjustable resistors 404 and 405, respectively, from their precharge voltage value.

If pulse signal 231 remained at a logic 0 level long enough, capacitors 408 and 409 would charge up to approximately a supply voltage level, such as Vdd of supply node 403 for example. However, if pulse signal 231 transitions back to a logic 1 level after one period, or one duty cycle, of clock signal 244, then capacitors 408 and 409 charge up to a voltage value determined by the pulse width of a pulse on pulse signal 231, responsive to a value of each capacitor, which in this example is assumed to be the same for capacitors 408 and 409, and a value set for each of adjustable resistors 404 and 405, respectively, for the different legs. By programming or setting adjustable resistors 404 and 405 to different values of resistances for such different legs, capacitors 408 and 409 may thus charge up to slightly different values, providing a differential or difference in voltage at times.

Optionally, in another implementation, only one leg in FIG. 4 may be used for measuring the pulse width of a pulse on pulse signal 231 to obtain a resolution substantially higher than using a differential voltage as described herein. However, a difference may be used to estimate jitter. This difference need not be determined inside a die, but such two voltage values may be converted to individual digital values to determine such difference external to such die, which need not be done in real time but may be performed offline. This allows flexibility in improving resolution across large PVT variations.

Again, in this example, analog voltage signal 211 and analog voltage signal 212 are not directly placed on an ATB 205, as ATB switches may not provide any decoupling of these nodes from a large capacitance of a shared ATB. Along those lines, a high-input impedance amplifier stage may be used.

Let $f_i(i=1,2)$ denote a transfer function of a leg i of programmable differential integrator 203, then output of $f_i$ may be denoted as $V_{1i}$, where $V_{1i}=f_i(t, R_i, C_i, V_{pre})$ for t being a period of a pulse on pulse signal 231, $R_i$ and $C_i$ being a resistance and a capacitance, respectively, for a leg i of programmable differential integrator 203, and $V_{pre}$ being a precharge voltage on capacitors 408 and 409. Once PMOS transistors 401 and 402 are ON, voltage across capacitors 408 and 409 follow an RC trajectory. Assuming PMOS transistors 401 and 402 resistance in an ON state is substantially smaller than $R_i$, and assuming PMOS transistors 401 and 402 spend very little time in saturation, voltage level after time t, namely pulse width of a pulse P on pulse signal 231, may generally be expressed as:

$$V_{1i}(t,R_i,V_{pre})=V_{pre}+(V_{dd}-V_{pre})(1-e^{-t/CR_i}) \quad (2.1)$$

$$V_1^{diff}(t,R_1,R_2,V_{pre})=V_{12}-V_{11}=(V_{dd}-V_{pre})(e^{-t/CR_1}-e^{-t/CR_2}) \quad (2.2)$$

Figure 5:
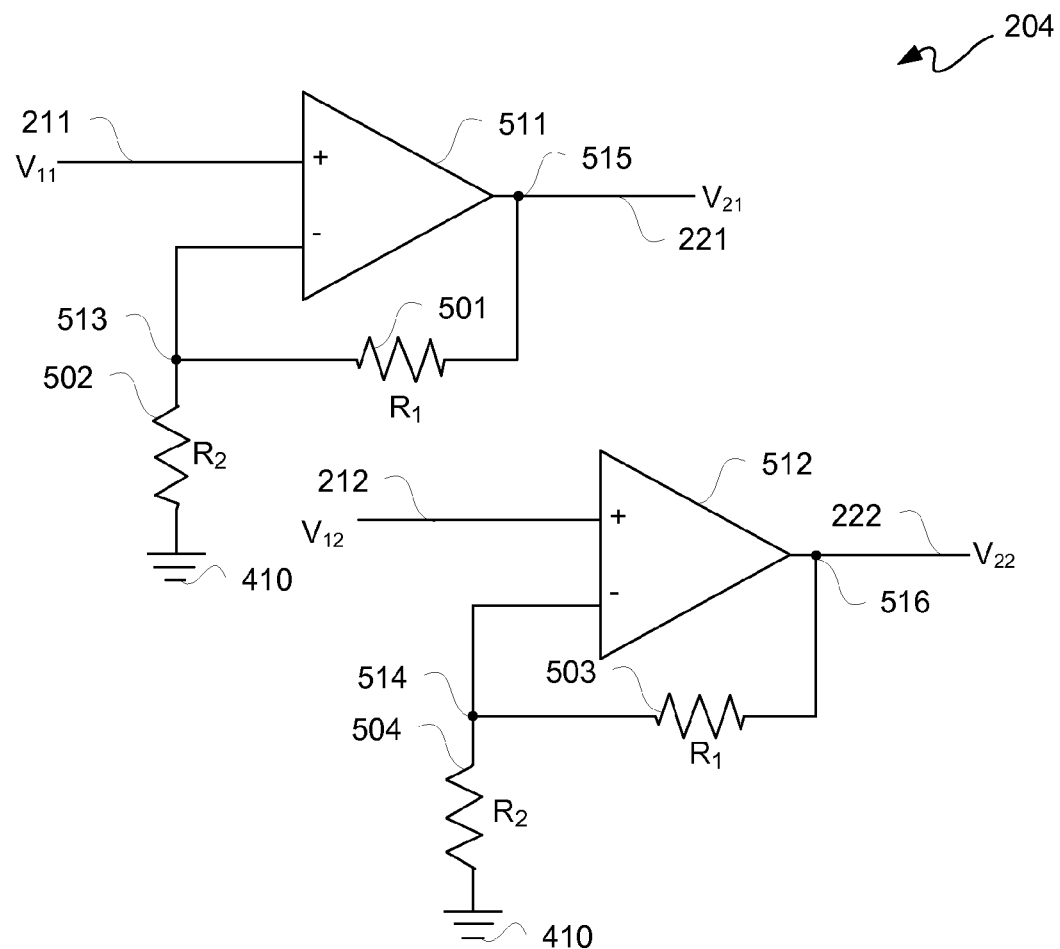
FIG. 5 is a circuit diagram depicting an exemplary high input-impedance dual amplifier.

FIG. 5 is a circuit diagram depicting an exemplary high input-impedance dual amplifier 204. Dual amplifier 204 includes resistors 501 through 504, as well as a operational amplifiers ("op amps") 511 and 512. Resistors 501 and 503 may, though need not, have a same resistance as in this example. Likewise, resistors 502 and 504 may, though need not, have a same resistance as in this example. In this example, resistance values R1 and R2 for these resistors 501 through 504 may be, though need not be, the same values as respectively set for adjustable resistors 404 and 405, respectively, in programmable differential integrator 203 of FIG. 4.

Op amp 511 is coupled to receive analog voltage signal 211 to a plus input port thereof. A minus input port of op amp 511 is coupled to a common node 513 between resistors 501 and 502. Another terminal of resistor 502 is couple to ground node 410, and another terminal of resistor 501 is coupled to an output node 515. An output of op amp 511 is provided to output node 515 from which output voltage signal 221 is sourced.

Op amp 512 is coupled to receive analog voltage signal 212 to a plus input port thereof. A minus input port of op amp 512 is coupled to a common node 514 between resistors 503 and 504. Another terminal of resistor 504 is couple to ground node 410, and another terminal of resistor 503 is coupled to an output node 516. An output of op amp 512 is provided to output node 516 from which output voltage signal 222 is sourced.

Dual amplifier 204 for each of op amps 511 and 512 may have a high input impedance, a large input common-mode linear range, a high-gain, and an immunity to V-T variations. However, in another implementation, other types of buffers, other than op amps, may be used.

In this example, op amps 511 and 512 are configured the same. However, in other implementations, op amps 511 and 512 need not be identically configured. Values for resistors 501 through 504 may be selected such that a resulting gain allows values of analog voltage signals 221 and 222 to be within an input common-mode range ("ICMR") of such op amps for linear operation and for output voltage signals 221 and 222 output from such op amps to be within the full output range of such op amps for the range of values of analog voltage signals 221 and 222.

Assuming identical amplifiers for op amps 511 and 512, gain of each amplifier may be denoted as G. For an ideal op amp, gain G is equal to $1+R_2R_1$. Along those lines, a differential output voltage from dual amplifier 204 may be express as:

$$V_2^{diff}(t,R_1,R_2,V_{pre})=V_{21}-V_{22}=G(V_{12}-V_{11})=G(V_{dd}-V_{pre})(e^{-t/CR_1}-e^{-t/CR_2}) \quad (2.3)$$

From the above equation, it follows that if resistance of $R_1$ is substantially greater than resistance $R_2$, a single maximum may be found at time t according to:

$$t = \frac{CR_1R_2}{R_1 - R_2} \ln \frac{R_1}{R_2} \qquad (2.4)$$

From the above equation, it should be understood that such maximum is independent of a precharge voltage.

Output voltage signals 221 and 222 respectively output from op amps 511 and 512 may be electrically communicated onto ATB 205 one output voltage signal at a time or simultaneously in differential mode, and sent to ADC 207 for conversion.

Figure 6:
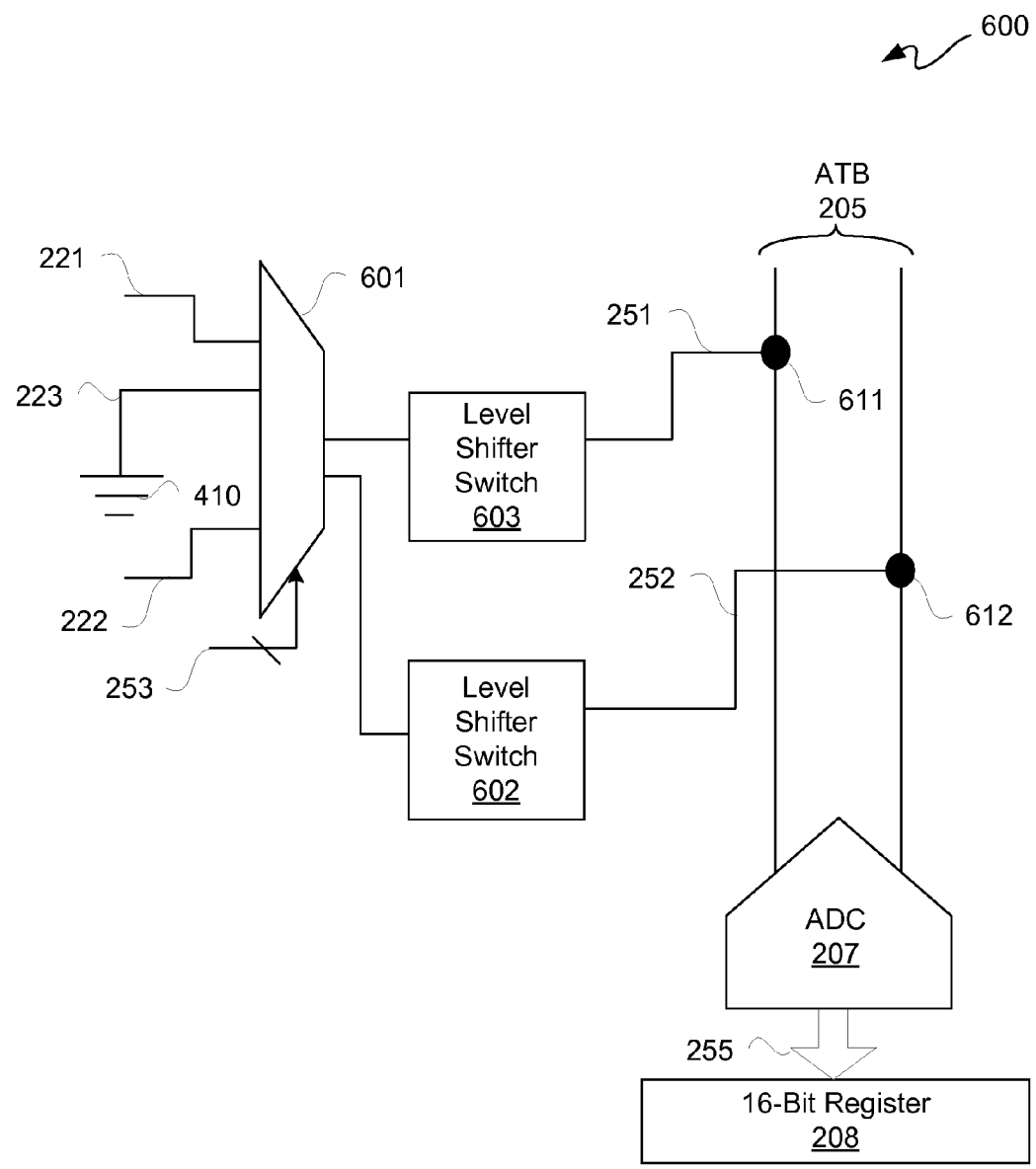
FIG. 6 is a block/circuit diagram depicting an exemplary portion of a time-to-digital converter.

FIG. 6 is a block/circuit diagram depicting an exemplary portion 600 of TDC 220, which is not shared with distributed period sensor 210. Output voltage signals 221 and 222, as well as a ground signal 223, are input to multiplexer 601, and a selected two of such signals 221, 222 and 223 are output from multiplexer 601 two at a time responsive to control select signal 253. One output from multiplexer 601 is provided as an input to level shifter switch 602, and another output from multiplexer 601 is provided as an input to level shifter switch 603. Multiplexer 601 and level shifter switches 603 and 602 may be part of ATB 205. Along the above lines, control select 253 may be set to output ground signal 223 to level shifter switch 602 and to toggle between outputting either output voltage signal 221 or 222 to level shifter switch 603. This mode may be thought of as a reference mode, as ground signal 223 is provided as a reference for both of output signals 221 and 222. In a differential mode, control select signal 253 may be set to provide output voltage 221 to one of level shifter switch of level shifter switches 602 or 603 and to provide output voltage 222 to the other level shifter switch of level shifter switches 602 or 603.

In a reference mode, output of level shifter switch 603 may be a level shifted version of either of output voltage signals 221 or 222, as applicable, namely value output signal 251. Value output signal 251 may be provided to ATB node 611 of ATB 205. Another ATB node 612 may be coupled to a value reference signal 252. Value reference signal 252 may be sourced from level shifter switch 602, and level shifter switch 602 may have a fixed voltage reference input from output of ground signal 223 from multiplexer 601. In this example, such fixed reference voltage input is sourced ground signal 223 from ground node 410; however, in other implementations, values other than zero volts may be used as a voltage reference input. Accordingly, values on ATB 205 may be output as value output signal 251, as respectively associated with either output voltage signal 221 or output voltage signal 222, and value reference signal 252. Value output signal 251 and value reference signal 252 may be provided from ATB 205 as respective inputs, namely a differential input, to ADC 207.

In a differential mode, output of level shifter switch 602 for example may be a level shifted version of output voltage signal 221 to provide value output or reference signal 252 to ATB node 612, and output of level shifter switch 603 for example may be a level shifted version of output voltage signal 222 to provide value output or reference signal 251 to ATB node 611. Again, value output signal 251 and value reference signal 252 may be provided from ATB 205 as respective inputs, namely a differential input, to ADC 207.

Assuming $\alpha_1$ and $\alpha_2$ are respective noise-gains of programmable differential integrator 203 and dual amplifier 204, and $\beta_1$ and $\beta_2$ are respective noise-offsets of programmable differential integrator 203 and dual amplifier 204, then using Equation 2.3 a measured value of output voltage signal 221 may be general expressed as:

$$V_{2i}' = -\alpha_1\alpha_2 GV_{1i} + [\alpha_2(V_{dd}-V_{pre})V_{dd}-V_{pre}-\beta_1\alpha_2 G+\beta_2]$$
$$= \alpha_C V_{1i} + \beta_C \qquad (2.5)$$

where $\alpha_C$ and $\beta_C$ are a composite gain and a composite offset, respectively. Because voltages $V_{1i}$ and $V_{2i}$ are functions of a time period t, from Equations 2.2 and 2.3, a differential voltage may be determined as follows:

$$V_2'^{diff} = V_{21}'(t) - V_{22}'(t) = \alpha_C V_{12}(t) - V_{11(t)} = \alpha_C(V_{dd}-V_{pre})$$
$$(e^{-t/CR_1} - e^{-t/CR_2}) \qquad (2.6)$$

As indicated in the above Equation, taking the difference between two output voltage values, whether in digital or analog form, removes a composite DC noise-offset. Removal of a composite noise-gain may be done by characterization using a clean or otherwise generally jitter-free clock, which may be performed in a controlled environment. However, a clean signal (such as a clock) is not required for sampling.

Figure 7:
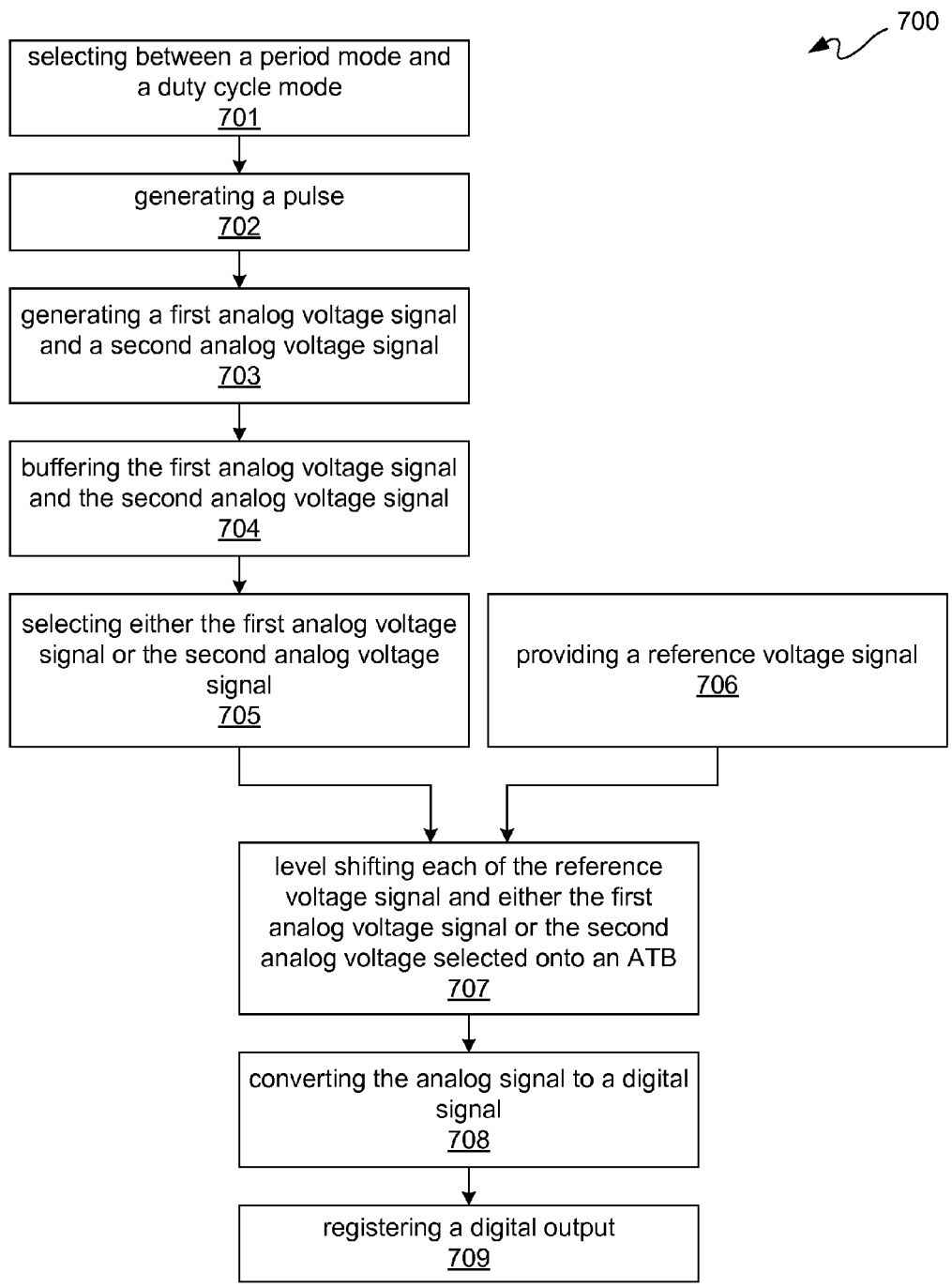
FIG. 7 is a flow diagram depicting an exemplary clock period/duty cycle determination flow.

FIG. 7 is a flow diagram depicting an exemplary clock period/duty cycle determination flow 700. With simultaneous reference to FIGS. 2-7, clock period/duty cycle determination flow 700 is further described.

At 701, a mode select signal 242 is provided to pulse generator 201, along with a clock signal 244 and a trigger signal 241. Mode select signal 242 is for selecting between a period mode and a duty cycle mode. At 702, a pulse is generated on pulse signal 231 with pulse generator 201 of period sensor 210 responsive to such signals 241 and 244 for a selected mode. Such pulse is associated with a period of clock signal 244 responsive to selection of a period mode, and such pulse is associated with a duty cycle of clock signal 244 responsive to selection of a duty cycle mode. At 703, programmable differential integrator 203 generates at least one analog signal responsive to such pulse, such as at least one or both of analog voltage signal 211 and analog voltage signal 212. Assuming analog voltage signals 211 and 212 are generated by programmable differential integrator 203 responsive to such pulse, analog voltage signals 211 and 212 may be generated so as to be different from one another.

At 704, analog voltage signal 211 and 212 are buffered, which may include respective amplification by op amps 511 and 512 such as previously described. At 705, either analog voltage signal 211 or analog voltage signal 212 is selected, such as from multiplexer 601, for providing to ATB 205. At 706, a reference voltage signal is provided. At 707, either analog voltage signal 211 or analog voltage signal 212 selected is level shifted and provided onto ATB 205. Furthermore, at 707, such reference voltage signal is level shifted and provided onto ATB 205. For example, value output signal 251 and value reference signal 252 may be level-shifted signals for providing to ATB 205 as a differential input for ADC 207.

At 708, effectively a selected analog signal is converted from such differential input to a digital signal with a differential ADC 207. Such analog signal is coupled to a first input port of differential ADC 207 and such reference signal is coupled to a second input port of such differential ADC 207. At 709, a digital output of differential ADC 207 is registered.

As described herein, it should be appreciated that an ADC and an ATB, which may be found in an FPGA, may be reused for clock jitter measurement. A clock jitter measurement system is at least substantially invariant with respect to one or more process-voltage-temperature or PVT variations. Furthermore, such clock jitter measurement system has a low area circuit overhead due to sharing of components. Additionally, due to having adjustable parameters, a wide range of clock frequencies may be measured. Moreover, the same clock jitter measurement system may be used for measuring period jitter, duty cycle jitter, and cycle-to-cycle jitter. Such clock jitter measurement system is not restricted to locations where one or more low-jitter reference signals are present. Such measurement may be a high resolution measurement, for example with a resolution down to 0.1% or better with respect to a signal period. Even though a clock signal was described, other periodic, pulsed, or oscillating signals may be used, and other types of time-to-digital conversions may be used for determining signal parameters other than those associated with clock jitter.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
a period sensor; and
a time-to-digital converter coupled to the period sensor;
wherein the period sensor includes a pulse generator to generate a pulse;
wherein an integrator of the period sensor is coupled to receive the pulse to generate an analog voltage signal responsive to the pulse; and
wherein the time-to-digital converter includes an analog-to-digital converter coupled to provide a digital signal associated with the analog voltage signal.

2. The apparatus according to claim 1, wherein:
the analog voltage signal is a first analog voltage signal;
the integrator generates the first analog voltage signal and a second analog voltage signal responsive to the pulse; and
the first analog voltage signal and the second analog voltage signal are generated by the integrator to be different from one another.

3. The apparatus according to claim 2, wherein:
the period sensor is a distributed period sensor; and
the integrator is a programmable differential integrator.

4. The apparatus according to claim 3, wherein the programmable differential integrator comprises a precharge circuit and at least one resistance-capacitance ("RC") leg.

5. The apparatus according to claim 4, wherein:
the precharge circuit includes a first adjustable resistor;
the at least one RC leg includes at least one of an adjustable resistor and an adjustable capacitor.

6. The apparatus according to claim 2, wherein:
the time-to-digital converter is a differential time-to-digital converter;
the differential time-to-digital converter comprises the analog-to-digital converter coupled to at least one register; and
the analog-to-digital converter is coupled to receive either the first analog voltage signal or the second analog voltage signal to provide a digital output of the digital signal responsive thereto for respective storage in the at least one register.

7. The apparatus according to claim 6, wherein the period sensor and the differential time-to-digital converter share a buffer coupled to receive the first analog voltage signal and the second analog voltage signal to respectively provide a first output voltage and a second output voltage.

8. The apparatus according to claim 7, wherein:
the first output voltage and the second output voltage are coupled to a first level shifter switch for input of a level-shifted version thereof either onto a first input node of an analog test bus;
a reference voltage is coupled to a second level shifter switch for input of a level-shifted version thereof onto a second input node of the analog test bus; and
the first input node and the second input node are respectively coupled to a differential input of the analog-to-digital converter.

9. The apparatus according to claim 7, wherein:
the first output voltage is coupled to a first level shifter switch for input of a level shifted version thereof onto a first input node of an analog test bus;
the second output voltage is coupled to a second level shifter switch for input of a level-shifted version thereof onto a second input node of the analog test bus; and
the first input node and the second input node are respectively coupled to a differential input of the analog-to-digital converter.

10. The apparatus according to claim 7, wherein:
the buffer comprises a first operational amplifier, a second operational amplifier and a plurality of resistors;
a first input port of each of the first operational amplifier and the second operational amplifier are respectively coupled to receive the first analog voltage signal and the second analog voltage signal; and
a second input port of each of the first operational amplifier and the second operational amplifier are respectively coupled to an input impedance provided with a respective portion of the plurality of resistors.

11. The apparatus according to claim 1, wherein the period sensor further includes a programmable divider coupled to receive a clock signal to provide a divided down version thereof to the pulse generator.

12. The apparatus according to claim 1, wherein:
the pulse generator is coupled to receive a trigger signal, a clock signal, and a mode select signal; and
the mode select signal is for selection between a period mode and a duty cycle mode.

13. A method, comprising:
generating a pulse with a pulse generator of a period sensor responsive to a clock signal and a trigger signal provided to the pulse generator;
generating an analog signal from the pulse with an integrator;
converting the analog signal to a digital signal with a differential analog-to-digital converter of a time-to-digital converter;
wherein the analog signal is coupled to a first input port of the differential analog-to-digital converter;
wherein a reference signal is coupled to a second input port of the differential analog-to-digital converter; and
registering the digital signal output from the differential analog-to-digital converter.

14. The method according to claim 13, wherein:
the analog voltage signal is a first analog voltage signal;
the integrator generates the first analog voltage signal and a second analog voltage signal responsive to the pulse; and
the first analog voltage signal and the second analog voltage signal are generated by the integrator to be different from one another.

15. The method according to claim 14, further comprising:
buffering the first analog voltage signal and the second analog voltage signal;
selecting either the first analog voltage signal or the second analog voltage signal for providing to an analog test bus; and providing the reference signal to the analog test bus with either the first analog voltage signal or the second analog voltage selected.

16. The method according to claim 15, further comprising level shifting each of the reference signal and either the first analog voltage signal or the second analog voltage selected for providing to the analog test bus.

17. A method, comprising:
generating a pulse with a pulse generator of a period sensor responsive to a clock signal and a trigger signal provided to the pulse generator;
generating a first analog voltage signal and a second analog voltage signal from the pulse with from a first integrator leg and a second integrator leg;
wherein the first analog voltage signal and the second analog voltage signal are generated to be different from one another;
converting the first analog voltage signal and the second analog voltage signal to a digital signal with a differential analog-to-digital converter of a time-to-digital converter;
wherein the first analog voltage signal is coupled to a first input port of the differential analog-to-digital converter;
wherein the second analog voltage signal is coupled to a second input port of the differential analog-to-digital converter; and
registering the digital signal output from the differential analog-to-digital converter.

18. The method according to claim 17, further comprising:
buffering the first analog voltage signal and the second analog voltage signal;
selecting both the first analog voltage signal and the second analog voltage signal for providing to an analog test bus; and
providing both the first analog voltage signal and the second analog voltage selected to the analog test bus for input to the differential analog-to-digital converter.

19. The method according to claim 17, further comprising level shifting each of the first analog voltage signal and the second analog voltage selected for providing to the analog test bus.

20. The method according to claim 17, further comprising:
providing a mode select signal to the pulse generator;
selecting between a period mode and a duty cycle mode; and
setting a multiplexer control select signal to select a differential mode as between the differential mode and a reference mode.

* * * * *